United States Patent
Awano et al.

[11] Patent Number: 5,698,868
[45] Date of Patent: Dec. 16, 1997

[54] HIGH-SPEED HETEROJUNCTION TRANSISTOR

[75] Inventors: Yuji Awano, Tokyo; Yasutake Hirachi, Musashino; Kohki Hikosaka, Atsugi, all of Japan

[73] Assignee: Fujitsu Limited, Kawasaki, Japan

[21] Appl. No.: 384,387

[22] Filed: Feb. 3, 1995

Related U.S. Application Data

[63] Continuation of Ser. No. 38,062, Mar. 29, 1993, abandoned, which is a continuation of Ser. No. 764,063, Sep. 24, 1991, abandoned, which is a continuation of Ser. No. 498,488, Mar. 26, 1990, abandoned, which is a continuation of Ser. No. 68,164, Jun. 30, 1987, abandoned.

[30] Foreign Application Priority Data

Jul. 3, 1986 [JP] Japan ................... 61-156493

[51] Int. Cl.$^6$ ............................... H01L 31/0328
[52] U.S. Cl. .................. 257/183; 257/192; 257/197; 257/201; 257/615
[58] Field of Search ................ 357/16, 34, 22 A, 357/22 MD, 3; 257/183, 192, 194, 196, 197, 198, 201, 615

[56] References Cited

U.S. PATENT DOCUMENTS

| | | | |
|---|---|---|---|
| 4,119,994 | 10/1978 | Jain et al. | 357/16 |
| 4,366,493 | 12/1982 | Braslau et al. | 357/4 |
| 4,395,722 | 7/1983 | Esaki et al. | 257/201 |
| 4,460,910 | 7/1984 | Chappell et al. | 357/22 A |
| 4,821,090 | 4/1989 | Yokoyama | 257/198 |
| 4,845,541 | 7/1989 | Xu et al. | 257/198 |

*Primary Examiner*—Mark V. Prenty
*Attorney, Agent, or Firm*—Staas & Halsey

[57] ABSTRACT

A high-speed heterojunction transistor includes a first region for controlling current, and a second region for receiving carriers which have passed the first region. An energy level difference between a lowermost valley of energy and an upper valley of energy in the conduction band of a semiconductor material constituting the second region is greater than that of a semiconductor material constituting the first region.

14 Claims, 5 Drawing Sheets

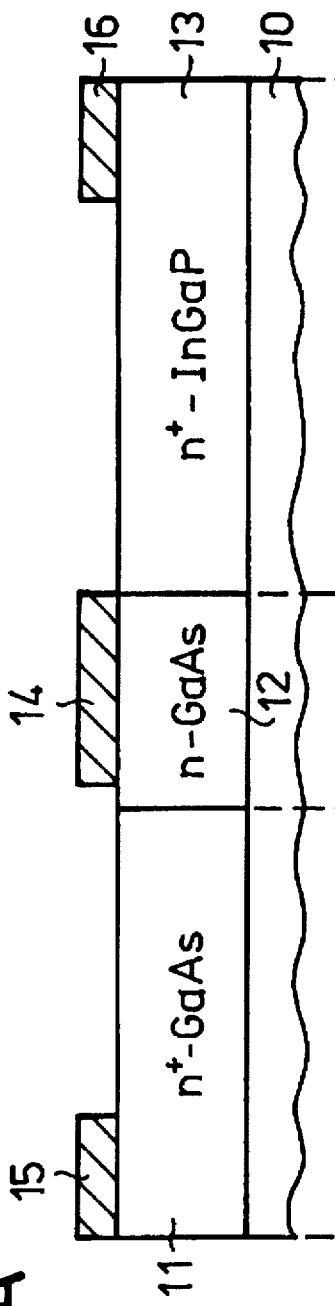
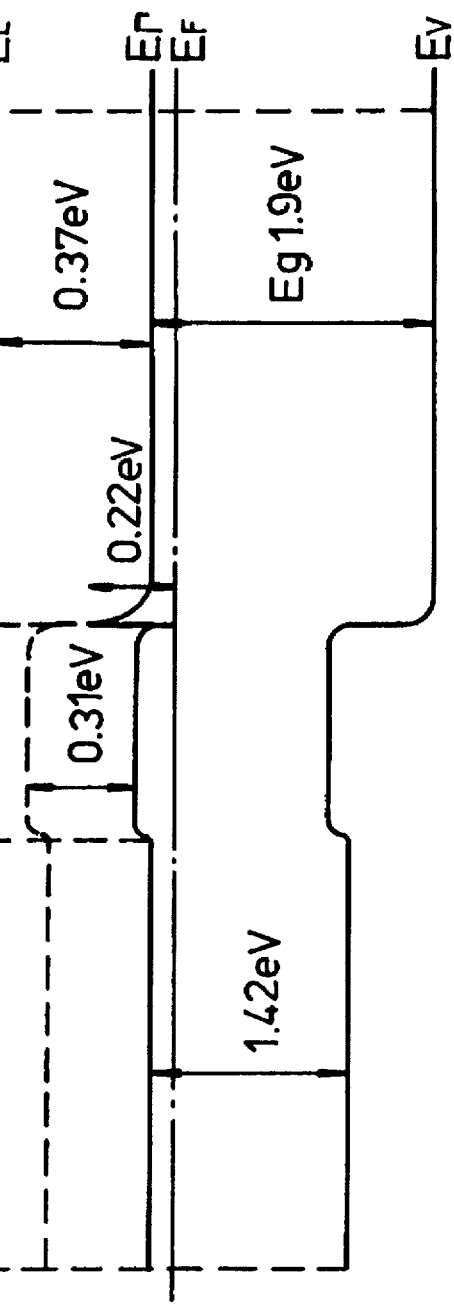
FIG.2A
FIG.2B

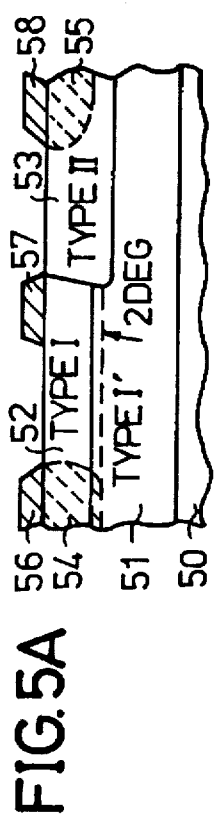
FIG.4A
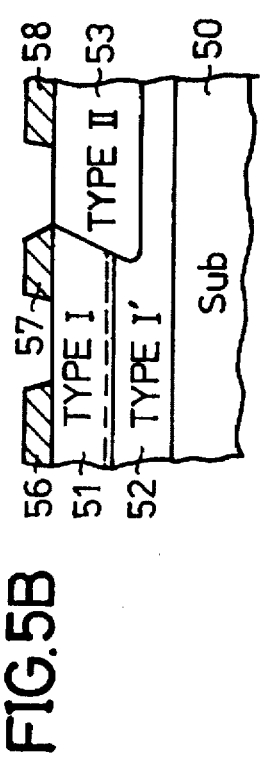
FIG.4B
FIG.4C
FIG.4D
FIG.4E
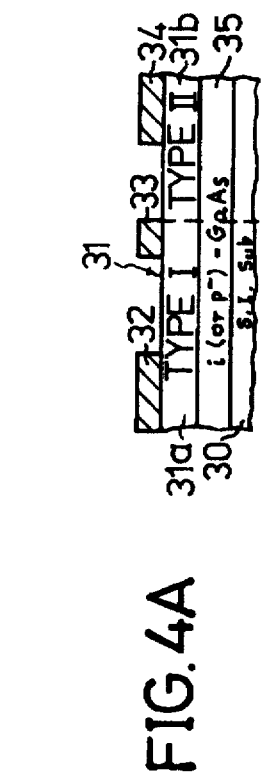
FIG.5A
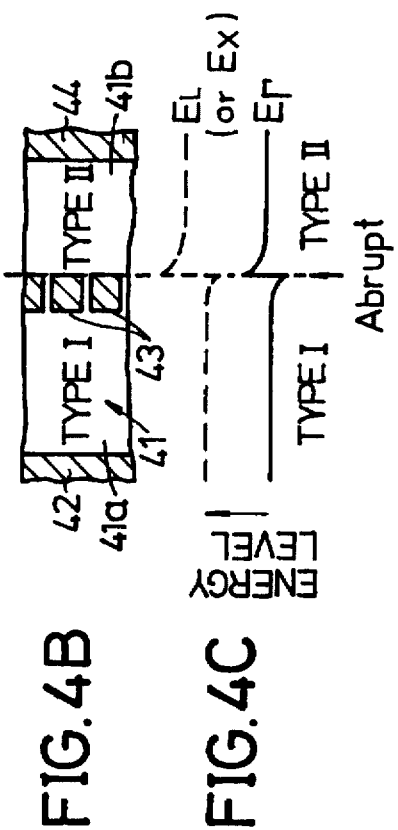
FIG.5B
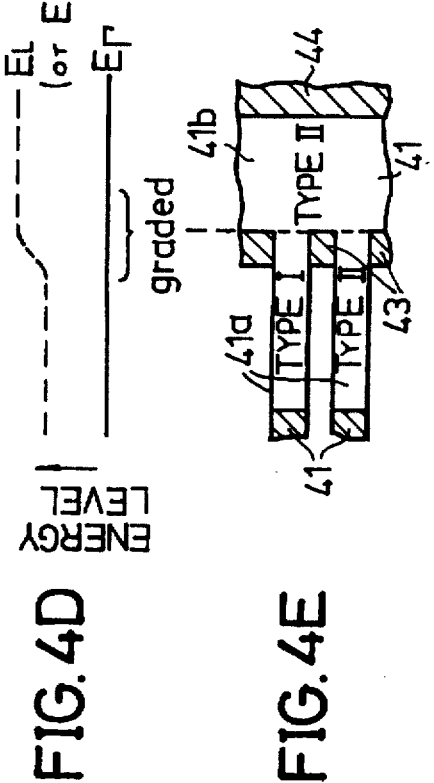
FIG.6

HIGH-SPEED HETEROJUNCTION TRANSISTOR

This application is a continuation of application Ser. No.08/038,062, filed Mar. 29, 1993, now abandoned, which is a continuation of application Ser. No. 07/764,063, filed Sep. 24, 1991, abandoned, which is a continuation of application Ser. No.07/498/488, filed Mar. 26, 1990, abandoned, which is a continuation of application Ser. No. 07/068,164 filed Jun. 30, 1987, abandoned.

BACKGROUND OF THE INVENTION

The present invention generally relates to high-speed transistors such as gallium arsenide field effect transistors (GaAs FETs) which operate with high-velocity carriers, and more particularly to a high-speed heterojunction transistor in which there is no decrease in the operation speed due to intervalley scattering of electrons even when operated at a high voltage.

In a semiconductor material such as GaAs having valleys at points (100) and (111) which are upper valleys at relatively low energy positions in addition to a valley (hereinafter referred to as a lower valley) at a point (000) which is a valley of the minimum energy of the conduction band in the momentum space, the electrons show complex behavior under a high electric field. For example, there is the so-called Gunn effect. The effective mass of the electrons within the upper valley is greater than that within the lower valley, and the scattering frequency is large in the upper valley. For this reason, the Gunn effect is caused by the electrons which enter the upper valley and are slowed down.

It is known that the transition of electrons between the valleys occurs due to the scattering with the lattice vibration. Because of this intervalley scattering, the high energy electrons are given momentum in a direction opposite to the electric field and are returned back into a current control region when the submicron-channel GaAs FET is operated at a high voltage, even when the intervalley scattering occurs in a region where the carriers are to be absorbed. As a result, the high-speed operation of the submicron-channel GaAs FET is limited by the intervalley scattering. This phenomenon was discovered by one of the present inventors and reported in "Monte Carlo Particle Simulation of GaAs Submicron $n^+$-i-$n^+$ Diode" by Y. Awano et al., ELECTRONICS LETTERS, 4th Feb. 1982, Vol. 18, No. 3, pp.133–135. A more detailed description on this phenomenon will be given later on in the present specification in conjunction with drawings.

Although the above described phenomenon occurs, the use of GaAs enables the transistor to carry out a high speed operation when compared to the case where another low-mobility semiconductor material is used for the transistor. However, in order to operate the transistor using GaAs at an even higher speed, the undesirable effects of the intervalley scattering must be minimized. But the problem of the intervalley scattering that occurs when the submicron-channel transistor using GaAs is to operate at an extremely high speed was only discovered recently by one of the present inventors as mentioned before, and for this reason, no measures have yet been proposed to overcome this problem.

SUMMARY OF THE INVENTION

Accordingly, it is a general object of the present invention to provide a novel and useful high-speed heterojunction transistor in which the problems described heretofore are overcome.

Another and more specific object of the present invention is to provide a high-speed heterojunction transistor having such a construction that no intervalley scattering occurs or the undesirable effects of the intervalley scattering is negligible. According to the high-speed heterojunction transistor of the present invention, the intervalley scattering does not occur even when the high-speed heterojunction transistor is applied with a high voltage which would cause the intervalley scattering in the conventional high-speed transistor, and the effective velocity of the carrier will not decrease. Therefore, it is possible to apply a high voltage to the high-speed heterojunction transistor so as to carry out an extremely high-speed operation.

Still another object of the present invention is to provide a high-speed heterojunction transistor comprising a first region for controlling current, and a second region for receiving carriers which have passed the first region, where an energy level difference between a lowermost valley of energy and an upper valley of energy in the conduction band of a semiconductor material constituting the second region is greater than that of a semiconductor material constituting the first region.

A further object of the present invention is to provide a high-speed heterojunction transistor in which a junction between the first and second regions is an abrupt heterojunction.

Another object of the present invention is to provide a high-speed heterojunction transistor in which a junction between the first and second regions is a graded heterojunction.

Other objects and further features of the present invention will be apparent from the following detailed description when read in conjunction with the accompanying drawings.

BRIEF DESCRIPTION OF THE DRAWINGS

FIG. 2A is a cross sectional view showing an essential part of a first embodiment of the high-speed heterojunction transistor according to the present invention;

FIG. 2B is an energy band diagram of the first embodiment shown in FIG. 2A;

FIGS. 4A, 4B and 4E are cross sectional views respectively showing essential parts of second and third embodiments and a modification of the third embodiment of the high-speed heterojunction transistor according to the present invention;

FIGS. 4C and 4D are energy band diagrams of the second and third embodiments shown in FIGS. 4A and 4B with an abrupt heterojunction and a graded heterojunction, respectively;

FIGS. 5A and 5B are cross sectional views showing an essential part of a fourth embodiment of the high-speed heterojunction transistor according to the present invention;

FIG. 6 is a cross sectional view showing an essential part of a fifth embodiment of the high-speed heterojunction transistor according to the present invention;

DETAILED DESCRIPTION OF THE PREFERRED EMBODIMENTS

Figure 1A:
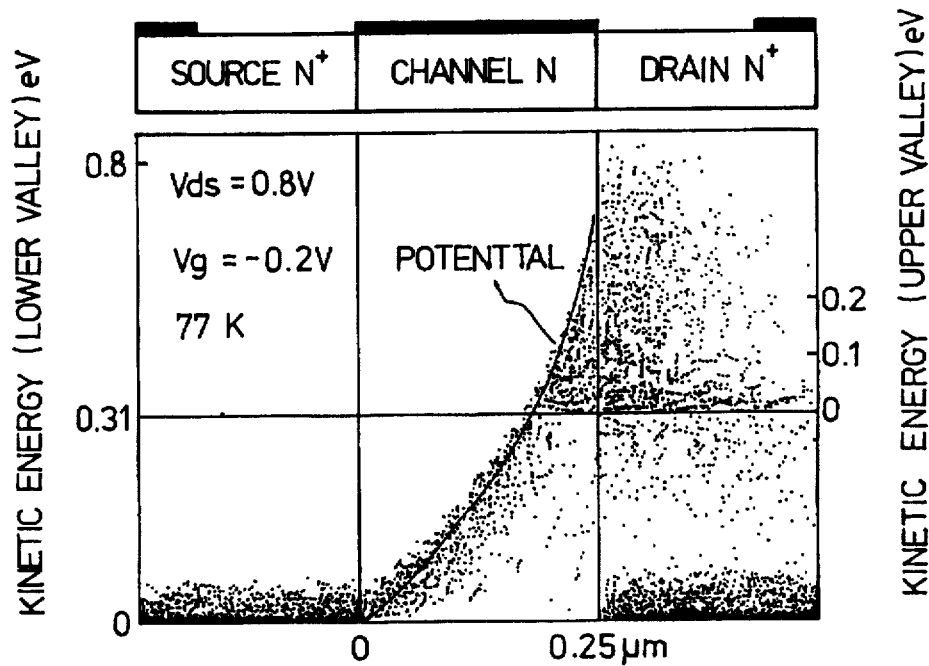
FIGS. 1A and 1B are diagrams respectively showing a kinetic energy distribution of electrons and velocity distribution of scattered electrons in the quarter-micron channel GaAs FET.
Figure 1B:
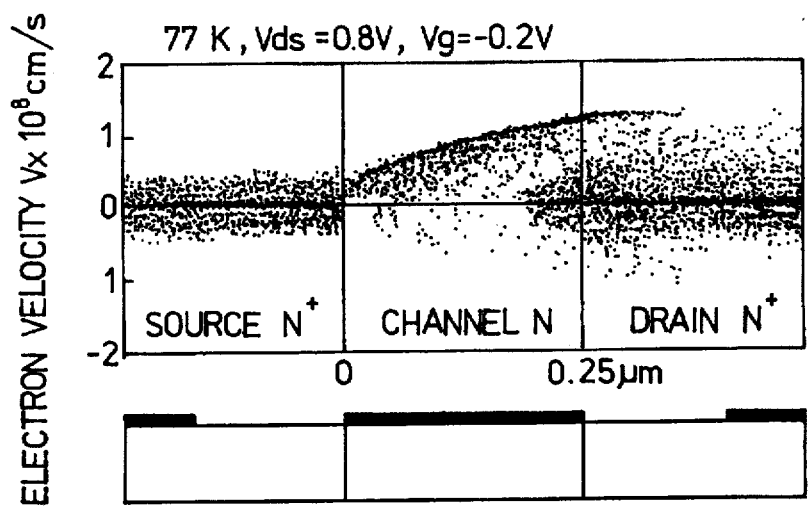

First, a description will be given on the intervalley scattering so as to facilitate the understanding of the present invention. FIG. 1A shows a kinetic energy distribution of electrons in a GaAs FET obtained by simulating the behavior of electrons in the GaAs FET having a channel length of 0.25 µm for the case where the lattice temperature is 77K and a source-drain voltage $V_{ds}$ of 0.8 V and a gate voltage $V_g$ of −0.2 V are applied to the GaAs FET. FIG. 1B shows a velocity distribution of electrons in this GaAs FET, and the ordinate indicates the electron velocity $V_x$. In FIG. 1A, the electrons in the lower valley and the electrons in the upper valley are shown in an overlapping manner, and the upper valley exists at an energy level 0.31 eV above the lower valley.

The source-drain voltage $V_{ds}$ applied to the GaAs FET mainly acts on the n-type channel region, and thus, a high electric field is generated in the n-type channel region and the electrons are accelerated therein. The kinetic energy of the accelerated electrons becomes high approaching toward the $n^+$-type drain region, and electrons with kinetic energy exceeding the energy level of the upper valley appear. This phenomenon may be easily understood from FIG. 1A because the electron density is high above the energy level of 0.31 eV.

When the above phenomenon is observed in terms of the velocity of electrons subjected to the intervalley scattering, it is seen from FIG. 1B that, in addition to the electrons having the normal velocity increase, there are electrons having negative velocity distributed within the n-type channel region in the vicinity of the $n^+$-type drain region. In other words, when the high energy electrons in the lower valley are subjected to the intervalley scattering, the electrons having the negative velocity appear, and the average velocity of the electrons is decreased, thereby preventing the operation of the GaAs FET at an extremely high speed. The stagnant electrons act as a space charge layer and absorb the applied voltage. Hence, the acceleration voltage in the vicinity of the $n^+$-type source region becomes limited.

The undesirable effects of the intervalley scattering in the GaAs FET described heretofore can also be seen in other semiconductor devices having similar energy band structures.

Although the above described phenomenon occurs, the use of GaAs enables the transistor to carry out a high speed operation when compared to the case where another low-mobility semiconductor material is used for the transistor. However, in order to operate the transistor using GaAs at an even higher speed, the undesirable effects of the intervalley scattering must be minimized. But the problem of the intervalley scattering when the submicron-channel transistor using GaAs is to operate at an extremely high speed was only discovered recently by one of the present inventors as mentioned before, and for this reason, no measures have yet been proposed to overcome this problem. Accordingly, the present invention provides a high-speed heterojunction transistor having a construction in which no intervalley scattering occurs or in which the undesirable effects of the intervalley scattering are negligible.

Next, a description will be given with respect to a first embodiment of the high-speed heterojunction transistor according to the present invention, by referring to FIGS. 2A and 2B. FIG. 2A is a cross sectional view showing an essential part of the first embodiment. In FIG. 2A, a GaAs FET comprises a semiinsulating GaAs substrate 10, a $n^+$-type GaAs source region 11, a n-type GaAs channel region 12, a $n^+$-type $In_{1-x}Ga_xP$ drain region 13, a gate electrode 14, a source electrode 15, and a drain electrode 16.

FIG. 2B shows the energy band diagram of the first embodiment shown in FIG. 2A. In FIG. 2B, $E_L$ denotes the energy level of the L-valley (upper valley), $E_\Gamma$ denotes the energy level of the Γ-valley (lower valley), $E_F$ denotes the Fermi energy level, $E_V$ denotes the energy level of the valence band, and $E_g$ denotes the energy band gap. It may be seen from FIG. 2B that the energy level difference between the upper and lower valleys in the channel region 12 is 0.31 eV, but the energy level difference between the upper and lower valleys in the drain region 13 is 0.37 eV and higher than that in the channel region 12. Hence, because of the higher energy level difference in the drain region 13, it is more difficult for the electrons to enter the upper valley compared to the conventional GaAs FET. Accordingly, even when the GaAs FET of the present embodiment is operated at a high voltage compared to that used in the conventional GaAs FET, there is no decrease in the electron velocity caused by the intervalley scattering, and the GaAs FET of the present embodiment can be operated at an extremely high speed.

As may be seen from FIG. 2B, a low energy barrier in the order of 0.22 eV exists at the junction between the channel region 12 and the drain region 13. However, the effect of this low energy barrier is negligible compared to the advantageous effects obtainable in the present embodiment, that is, the extremely high speed operation.

Figure 3A:
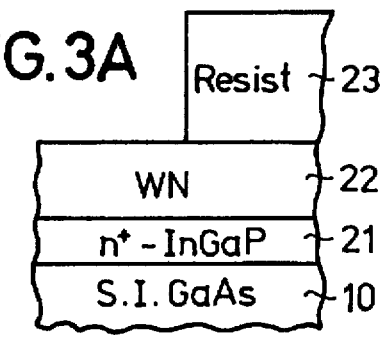
FIGS. 3A through 3I are cross sectional views for explaining the processes of producing the first embodiment of the high-speed heterojunction transistor according to the present invention.

Next, a description will be given on the processes of producing the GaAs FET shown in FIG. 2A, by referring to FIGS. 3A through 3I. In FIG. 3A, a $n^+$-type indium gallium phosphide (InGaP) layer 21 is grown epitaxially on the semiinsulating GaAs substrate 10 by a metal organic chemical vapor deposition (MOCVD), for example, and a metal layer such as a tungsten nitride (WN) layer 22 is sputtered on the InGaP layer 21. A resist layer 23 is formed on the WN layer 22 and is patterned.

Figure 3B:
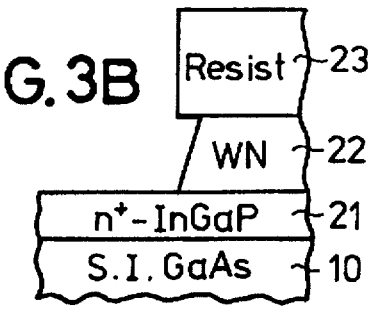

As shown in FIG. 3B, the WN layer 22 is etched by a $SF_6$ plasma etching, for example.

Figure 3C:
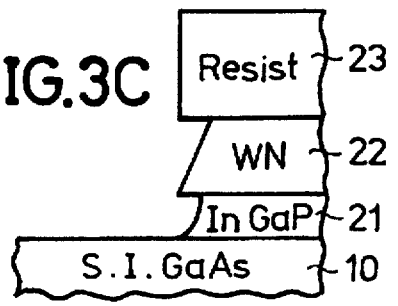

Then, as shown in FIG. 3C, the InGaP layer 21 is etched by a wet etching using $H_3PO_4+H_2O_2+H_2O$ as the etchant, for example.

Figure 3D:
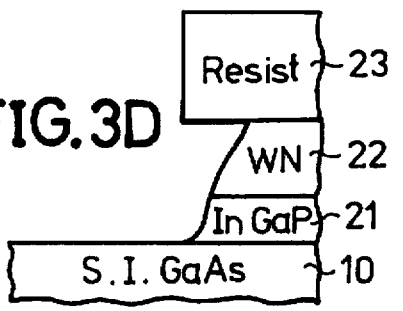
Figure 3E:
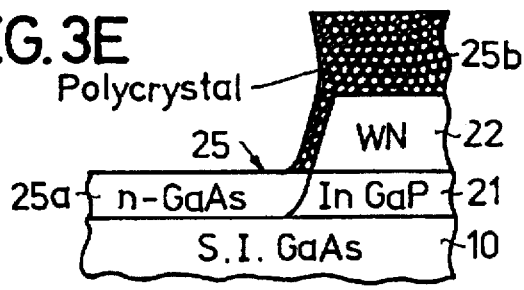

In addition, as shown in FIG. 3D, an overhanging portion of the WN layer 22 on the etched InGaP layer 21 is smoothened by a $SF_6$ plasma etching, for example.

Next, the resist layer 23 is removed, and a n-type GaAs layer 25 is grown epitaxially on the GaAs substrate 10 and on the WN layer 22. As a result, the n-type GaAs layer 25 on the GaAs substrate 10 are grown as a single crystal layer 25a while the n-type GaAs layer 25 on the WN layer 22 is grown as a polycrystal layer 25b.

Figure 3F:
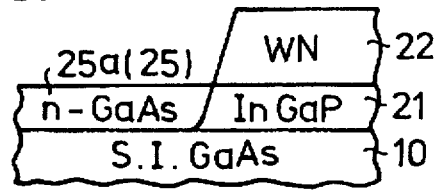

As shown in FIG. 3F, a wet etching using $H_3PO_4+H_2O_2+H_2O$ as the etchant, for example, is carried out so as to remove the polycrystal layer 25b which has a considerably high etching rate compared to the single crystal layer 25a.

Figure 3G:
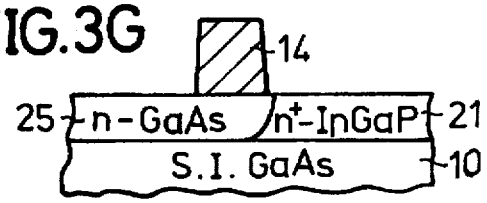
Figure 3H:
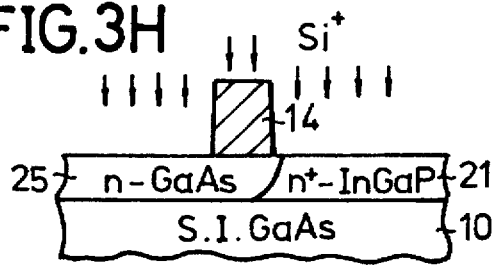
Figure 3I:
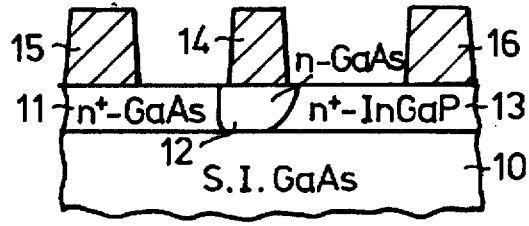

A gate electrode 14 is formed on the n-type GaAs layer (single crystal layer) 25 as shown in FIG. 3G, and $Si^+$ ions are implanted into the n-type GaAs layer 25 and the InGaP layer 21 as shown in FIG. 3H to dosages of $1\times10^{13}$ atoms per $cm^3$ at an energy of 70 keV and $2\times10^{13}$ atoms per $cm^3$ at an energy of 100 keV at a temperature of 800° C. for 30 seconds.

As a result, the n⁺-type GaAs source region 11, the n-type GaAs channel region 12 and the n⁺-type InGaP drain region 13 are formed on the GaAs substrate 10 as shown in FIG. 3L. The GaAs FET shown in FIG. 2A is obtained by forming the source electrode 15 on the n⁺-type GaAs source region 11, forming the drain electrode 16 on the n⁺-type InGaP drain region 13, and also carrying out an annealing.

In the first embodiment, the channel region 12 changes abruptly to the drain region 13 on the substrate 10, that is, the junction between the two regions 12 and 13 is an abrupt heterojunction. However, the junction between the two regions 12 and 13 may be a graded heterojunction so that the channel region 12 changes gradually to the drain region 13 on the substrate 10. Furthermore, GaAs is used for the channel region 12 and InGaP is used for the drain region 13. But other materials may be used for the channel and drain regions 12 and 13 as long as the energy level difference between the upper valley (L-valley or X-valley) and the lower valley (Γ-valley) of the drain region 13 is greater than that of the channel region 12.

Next, a description will be given on other embodiments of the high-speed heterojunction transistor according to the present invention. In the description given hereunder, it will be assumed that a type II semiconductor material (hereinafter simply referred to as a type II material) has an energy level difference between the upper and lower valleys greater than an energy level difference between the upper and lower valleys of a type I semiconductor material (hereinafter simply referred to as a type I material).

FIG. 4A shows a cross sectional view of an essential part of a second embodiment of the high-speed heterojunction transistor according to the present invention. In FIG. 4A, a metal semiconductor field effect transistor (MES FET) comprises a semiinsulating substrate 30, a buffer layer 35, a channel layer 31 which acts as a channel, a source electrode 32, a gate electrode 33, and a drain electrode 34. The buffer layer 35 may be an intrinsic (i-type) or p⁻-type GaAs or i-type AlGaAs layer. The channel layer 31 comprises a first layer portion 31a made of the type I material and a second layer portion 31b made of the type II material. The junction between the first and second layer portions 31a and 31b may be an abrupt heterojunction or a graded heterojunction. There is an ohmic contact between the source electrode 32 and the first layer portion 31a, a Schottky contact between the gate electrode 33 and the first layer portion 31a, and an ohmic contact between the drain electrode 34 and the second layer portion 31b.

FIG. 4B shows a cross sectional view of an essential part of a third embodiment of the high-speed heterojunction transistor according to the present invention. In FIG. 4B, a permeable base transistor (PBT) comprises a channel region 41, a source electrode 42, a drain electrode 43, and a gate electrode 44. The channel region 41 comprises a first region 41a made of the type I material and a second region 41b made of the type II material. The junction between the first and second regions 41a and 41b may be an abrupt heterojunction or a graded heterojunction. The source and gate electrodes 42 and 44 are ohmicly contacted to respective channel regions 41a and 41b. The drain electrode 43 has a Schottky junction or contact with the channel semiconductor material.

FIG. 4E shows a modification of the third embodiment, in which the first region 41a is a mesa-shape.

FIG. 4C shows the energy band diagram of the second and third embodiments respectively shown in FIGS. 4A, 4B and 4E for the case where the junction between the type I material and the type II material is an abrupt heterojunction. FIG. 4D shows the energy band diagram of the second and third embodiments respectively shown in FIGS. 4A, 4B and 4E for the case where the junction between the type I material and the type II material is a graded heterojunction. In FIGS. 4C and 4D, the same designations used in FIG. 2B are used, and the illustration of the Fermi level $E_F$ is omitted.

Next, a description will be given with respect to a fourth embodiment of the high-speed heterojunction transistor according to the present invention, by referring to FIG. 5A which shows a cross sectional view of an essential part of the fourth embodiment. In FIG. 5A, a high electron mobility transistor (HEMT) comprises a semiinsulating substrate 50, an intrinsic channel layer 51 made of a type Γ material, a carrier supply region 52 made of the type I material, a drain region 53 made of the type II material, alloyed regions 54 and 55, a source electrode 56, a gate electrode 57, and a drain electrode 58. A two dimensional electron gas layer is indicated by 2DEG in FIG. 5A. In the present embodiment, an energy level difference between upper and lower valleys of the type II material is greater than that of the type I material, and furthermore, the energy level difference between the upper and lower valleys of the type II material is also greater than that of the type Γ material. And, the carrier supply region 52 has a smaller electron affinity than that of the intrinsic channel layer 61. For example, intrinsic GaAs is used as the type Γ material, n-type aluminum gallium arsenide (AlGaAs) is used as the type I material, and a n⁺-type InGaP is used as the type II material.

In the fourth embodiment shown in FIG. 5A, the carriers are mainly transferred through the two dimensional electron gas layer 2DEG from the source alloyed region 54 to the drain alloyed region 55. Therefore, the drain region 53 has a larger thickness than that of the carrier supply region 52 so that the two dimensional electron gas layer 2DEG contacts to the drain region 53 made of the type II material. Furthermore, since the carriers sometimes transfer through the carrier supply region 52 under a predetermined gate voltage, the carrier supply region 52 is also made of type I material.

FIG. 5B shows a reverse type of the fourth embodiment. The difference between the fourth embodiment shown in FIG. 5A is that the carrier supply region 52 is formed on the substrate 50 and the intrinsic channel layer 51 is formed on the carrier supply region 52. The drain region 53 is made of the type II material and has a larger thickness than that of the intrinsic channel layer 51.

An essential part of a fifth embodiment of the high-speed heterojunction transistor according to the present invention is shown in FIG. 6. In FIG. 6, a heterojunction bipolar transistor comprises a semiinsulating GaAs substrate 60, a collector contact layer 67 made of the type II material, a collector electrode 61, a collector region 62 made of the type II material, a base region 63 made of the type I material, a base electrode 66, an emitter region 64, and an emitter electrode 65. For example, n-type InGaP is used as the type II material, and the collector region 62 is made of n⁻-type InGaP and the collector contact layer 67 is made of n⁺-type InGaP. In addition, p⁺-type GaAs is used as the type I material, and n⁺-type AlGaAs is used for the emitter region 64.

Figure 7:
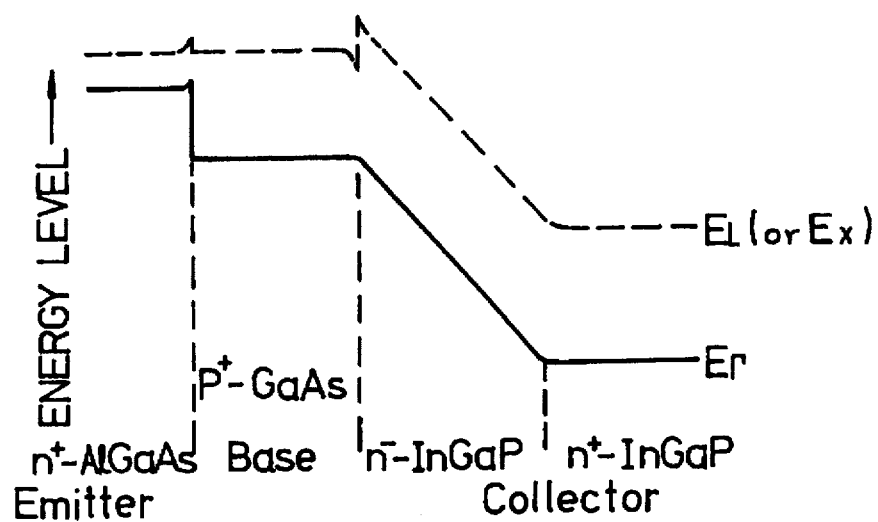
FIG. 7 is an energy band diagram of the fifth embodiment shown in FIG. 6.

FIG. 7 shows an energy band diagram of the fifth embodiment shown in FIG. 6. In FIG. 7, the same designations used in FIG. 2B are used, and the illustration of the Fermi level $E_F$ is omitted. It may be seen from FIG. 7 that the energy level difference between the upper valley (L-valley or X-valley) and the lower valley (Γ-valley) of the n⁻-type InGaP first collector region in the collector region 62 is greater than that of the p⁺-type GaAs base region 63.

Figure 8A:
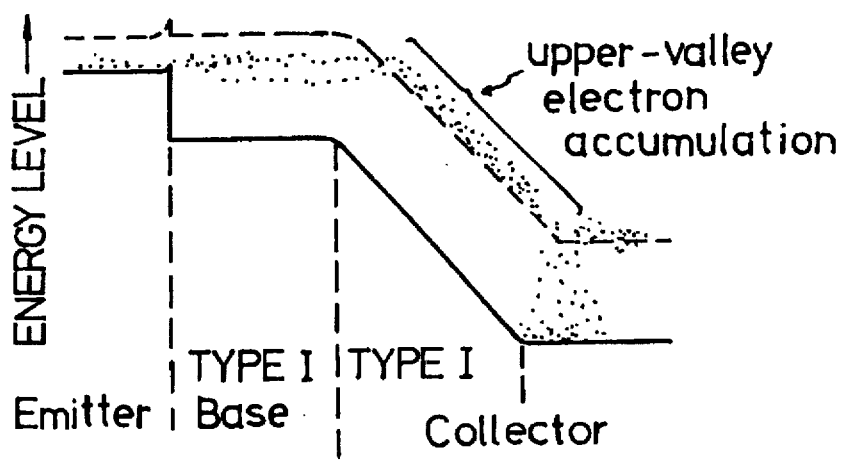
FIGS. 8A and 8B are energy band diagrams for explaining the differences in the characteristics of the conventional bipolar transistor and the bipolar transistor according to the present invention.

FIG. 8A is an energy band diagram showing the distribution of electrons in the conventional bipolar transistor in which both the base region 63 and the collector region 62 shown in FIG. 6 are made of the type I material. As may be seen from FIG. 8A, the electron accumulation is large in the upper valley of the first n⁻-type region of the collector region 62, and the thickness of the electron accumulation layer is relatively large. As a result, a breakdown may occur when a high voltage is applied to the conventional bipolar transistor, and the high speed operation is limited thereby.

Figure 8B:
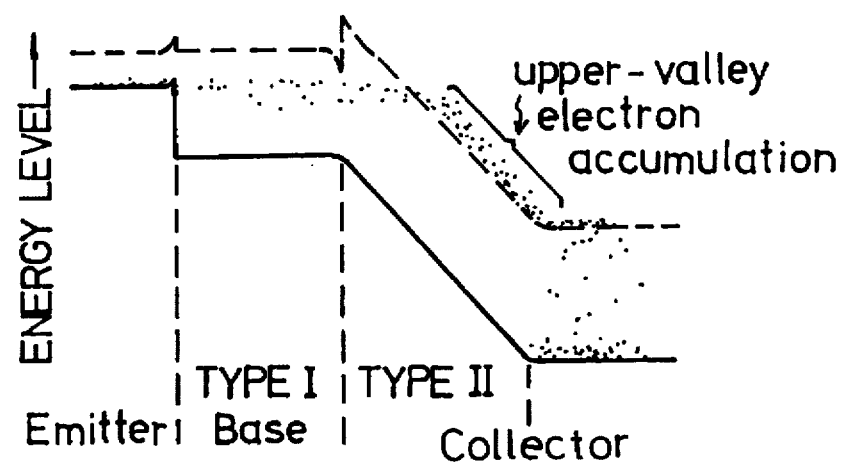

On the other hand, FIG. 8B is an energy band diagram showing the distribution of electrons in the fifth embodiment shown in FIG. 6. As described before, the base region 63 is made of the type I material while the collector region 62 is made of the type II material. As a result, the electron accumulation is small in the upper valley of the first n⁻-type region of the collector region 62, and the thickness of the electron accumulation layer is small compared to that of the conventional bipolar transistor. Therefore, it is possible to apply a high voltage to the heterojunction bipolar transistor and carry out an extremely high speed operation.

The combination of the type I material and the type II material is not limited to those of the embodiments, and various other combinations are possible. For example, doped InP having an energy level difference of 0.55 eV between the upper and lower valleys may be used as the type I material and doped indium gallium arsenide phosphide (InGaAsP) having an energy level difference of 0.8 eV to 1.2 eV between the upper and lower valleys may be used as the type II material. Similarly, doped InGaAs having an energy level difference of 0.55 eV and doped InGaAsP having an energy level difference of 0.8 eV to 1.2 eV may be used as the type I and type II materials, respectively. In addition, doped GaAs having an energy level difference of 0.3 eV and doped InGaP having an energy level difference of 0.37 eV may be used as the type I and type II materials, respectively.

The present invention is not limited to the heterojunction transistors described heretofore, and is also applicable to any heterojunction transistor having a corresponding heterojunction between a first region for controlling current and a second region for receiving carriers which have passed the first region.

Further, the present invention is not limited to these embodiments, but various variations and modifications may be made without departing from the scope of the present invention.

What is claimed is:

1. A a high-speed heterojunction transistor comprising:
a substrate;
a first region formed above said substrate, for controlling current, said first region being made of a first semiconductor material;
a second region, formed above said substrate adjacent to said first region, for receiving electrons which have passed said first region, said second region being made of a second semiconductor material having an energy level difference between an electron energy of a lowermost valley and an electron energy of an upper valley in a conduction band of said second semiconductor material which is greater than that of said first semiconductor material, the electron energy of said upper valley being greater than the electron energy of said lowermost valley;
a drain electrode ohmically contacting said second region; and
a gate electrode formed above said first region, said gate electrode forming a junction with said first region, and said second region being extended under said gate electrode.

2. A high-speed heterojunction transistor as claimed in claim 1, wherein said first and second regions respectively form a channel region and a drain region of a field effect transistor.

3. A high-speed heterojunction transistor as claimed in claim 1, wherein said first and second regions respectively form a channel region and a drain region of a metal semiconductor field effect transistor, and said gate electrode making Schottky contact with said first region.

4. A high-speed heterojunction transistor as claimed in claim 1, wherein said first semiconductor material is doped gallium arsenide (GaAs) and said second semiconductor material is doped indium gallium phosphide (InGaP).

5. A high-speed heterojunction transistor as claimed in claim 1, wherein said first semiconductor material is doped indium phosphide (InP) and said second semiconductor material is doped indium gallium arsenide phosphide (InGaAsP).

6. A high-speed heterojunction transistor as claimed in claim 1, wherein said first semiconductor material is doped indium gallium arsenide (InGaAs) and said second semiconductor material is doped indium gallium arsenide phosphide (InGaAsP).

7. A high-speed heterojunction transistor, as claimed in claim 1, further comprising:
an intrinsic semiconductor layer formed between said substrate and said first region, said intrinsic semiconductor layer being made of an intrinsic semiconductor material the energy level difference between the electron energy of said lowermost valley and the electron energy of said upper valley in said conduction band of said second semiconductor material being greater than that of said intrinsic semiconductor material.

8. A high-speed heterojunction transistor as claimed in claim 7, wherein said intrinsic semiconductor layer is made of intrinsic gallium arsenide (GaAs), said first semiconductor material is doped aluminum gallium arsenide (AlGaAs) said second semiconductor material is doped indium gallium phosphide (InGaP).

9. A high speed heterojunction transistor comprising:
a substrate;
a first region, formed above said substrate, for controlling current, said first region being made of a first semiconductor material;
a second region, formed above said substrate adjacent to said first region, for receiving electrons which have passed said first region, said second region being made of a second semiconductor material having an energy level difference between an electron energy of a lowermost valley and an electron energy of an upper valley in a conduction band of said second semiconductor material which is greater than that of said first semiconductor material, the electron energy of said upper valley being greater than the electron energy of said lowermost valley; and
a graded region formed between said first and second regions, said graded region having an energy level difference between an electron energy of a lowermost valley and an electron energy of an upper valley in a conduction band of said graded region increasing monotonously in a direction from said first region to said second region, the electron energy of said upper valley in the conduction band of said graded region is always higher than that of said first region.

10. A high speed heterojunction field effect transistor, comprising:

an N-type first semiconductor region made of a first semiconductor material, an N-type second semiconductor region made of a second semiconductor material adjacent said first semiconductor region, and an N-type third semiconductor region made of a third semiconductor material adjacent said second semiconductor region and spaced from said first semiconductor region by said second semiconductor region;

said first, second, and third semiconductor materials each being direct gap, having a conduction band direct gap electron energy valley minimum in energy-momentum space having a direct gap effective electron mass and a lowest conduction band indirect gap electron energy valley minimum in energy-momentum space at a higher energy than the energy of the corresponding direct gap valley and an indirect gap effective electron mass greater than the corresponding direct gap effective electron mass;

said first semiconductor material having a forbidden gap equal to or wider than said second semiconductor material;

the energy difference between the direct gap electron energy valley minimum and the lowest indirect gap electron energy valley minimum of said third semiconductor material being greater than the energy difference between the direct gap electron energy valley minimum and the lowest indirect gap electron energy valley minimum of said second semiconductor material, the energy difference between the direct gap electron energy valley minimum and the lowest indirect gap electron energy valley minimum of said first semiconductor material being no greater than the energy difference between the direct gap electron energy valley minimum and the lowest indirect gap electron energy valley minimum of said second semiconductor material;

a first contact to said first semiconductor region and a second contact to said third semiconductor region;

means for applying a voltage between said first contact and said second contact to cause electrons to flow from said first semiconductor region, through said second semiconductor region and into said third semiconductor region, upon suitable biasing of said second semiconductor region; and gate means for controllably depleting said second semiconductor region to control the flow of electrons from said first semiconductor region to said third semiconductor region, whereby energetic electrons passing into said third semiconductor region from said second semiconductor region are inhibited from transferring into the indirect gap valley of said third semiconductor material by reason of the greater energy difference between the direct and indirect gap valley minima in said third semiconductor material than in said second semiconductor material.

11. A high speed heterojunction bipolar transistor, comprising:

an N-type first semiconductor region made of a first semiconductor material, a P-type second semiconductor region made of a second semiconductor material adjacent said first semiconductor region, and an N-type third semiconductor region made of a third semiconductor material adjacent said second semiconductor region and spaced from said first semiconductor region by said second semiconductor region;

said first, second, and third semiconductor materials each being direct gap, having a conduction band direct gap electron energy valley minimum in energy-momentum space having a direct gap effective electron mass and a lowest conduction band indirect gap electron energy valley minimum in energy-momentum space at a higher energy than the energy of the corresponding direct gap valley and an indirect gap effective electron mass greater than the corresponding direct gap effective electron mass;

the energy difference between the direct gap electron energy valley minimum and the lowest indirect gap electron energy valley minimum of said third semiconductor material being greater than the energy difference between the direct gap electron energy valley minimum and the lowest indirect gap electron energy valley minimum of said second semiconductor material, the energy difference between the direct gap electron energy valley minimum and the lowest indirect gap electron energy valley minimum of said first semiconductor material being no greater than the energy difference between the direct gap electron energy valley minimum and the lowest indirect gap electron energy valley minimum of said second semiconductor material;

said first semiconductor material having a wider forbidden gap than said second semiconductor material;

a first contact to said first semiconductor region and a second contact to said third semiconductor region;

means for applying a voltage between said first contact and said second contact to cause electrons to flow from said first semiconductor region, through said second semiconductor region and into said third semiconductor region, upon suitable biasing of said second semiconductor region; and means for biasing said second semiconductor region with respect to said first semiconductor region to control the flow of electrons from said first semiconductor region to said third semiconductor region, whereby energetic electrons passing into said third semiconductor region from said second semiconductor region are inhibited from transferring into the indirect gap valley of said third semiconductor material by reason of the greater energy difference between the direct and indirect gap valley minima in said third semiconductor material than in said second semiconductor material.

12. A high speed heterojunction transistor as claimed in claim 1, wherein a junction between said first and second regions is an abrupt heterojunction.

13. A high speed heterojunction transistor as claimed in claim 1, wherein a junction between said first and second regions is a graded heterojunction.

14. A high speed heterojunction transistor as claimed in claim 7, wherein said first and second regions respectively form a carrier supply region and a drain region of a high electron mobility transistor.

* * * * *